United States Patent
Furusawa

(10) Patent No.: US 6,812,575 B2
(45) Date of Patent: Nov. 2, 2004

(54) SEMICONDUCTOR DEVICE

(75) Inventor: Koji Furusawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/939,761

(22) Filed: Aug. 28, 2001

(65) Prior Publication Data

US 2002/0024146 A1 Feb. 28, 2002

(30) Foreign Application Priority Data

Aug. 29, 2000 (JP) ........................................ 2000-259227

(51) Int. Cl.$^7$ ............................................. H01L 23/48
(52) U.S. Cl. ........................ 257/774; 257/775; 257/776; 257/777; 257/784; 438/617; 438/782
(58) Field of Search ................................. 257/777, 774, 257/775, 776, 784; 438/617, 782

(56) References Cited

U.S. PATENT DOCUMENTS

| | | | | |
|---|---|---|---|---|
| 5,012,323 A | * | 4/1991 | Farnworth | 357/75 |
| 5,238,878 A | * | 8/1993 | Shinohara | 437/231 |
| 5,495,398 A | * | 2/1996 | Takiar et al. | 361/790 |
| 5,502,289 A | * | 3/1996 | Takiar et al. | 174/266 |
| 5,552,209 A | * | 9/1996 | McCutcheon | 428/209 |
| 5,567,654 A | * | 10/1996 | Beilstein, Jr. et al. | 437/209 |
| 5,804,004 A | * | 9/1998 | Tuckerman et al. | 156/60 |
| 5,861,666 A | * | 1/1999 | Bellaar | 257/686 |
| 5,870,289 A | * | 2/1999 | Tokuda et al. | 361/779 |
| 6,100,594 A | * | 8/2000 | Fukui et al. | 257/777 |
| 6,143,401 A | * | 11/2000 | Fischer et al. | 428/322.7 |
| 6,181,002 B1 | * | 1/2001 | Juso et al. | 257/686 |
| 6,274,404 B1 | * | 8/2001 | Hirasawa et al. | 438/107 |
| 6,287,942 B1 | * | 9/2001 | Farnworth et al. | 438/462 |

FOREIGN PATENT DOCUMENTS

| | | |
|---|---|---|
| JP | 61287133 A | 12/1986 |
| JP | 2-146436 | 12/1990 |
| JP | A 4-127545 | 4/1992 |
| JP | A 4-284663 | 10/1992 |
| JP | A 8-213545 | 8/1996 |
| JP | A 11-220091 | 8/1999 |
| JP | A 11-312780 | 11/1999 |
| JP | A 2001-77298 | 3/2001 |

* cited by examiner

Primary Examiner—George Eckert
Assistant Examiner—Edgardo Ortiz
(74) Attorney, Agent, or Firm—Young & Thompson

(57) ABSTRACT

In a semiconductor device with a plurality of semiconductor chips stacked on a substrate, a wiring layer disposed so as to be sandwiched between the semiconductor chips, and a plurality of bonding pads, for connecting a bonding wire, provided on the wiring layer, are provided.

14 Claims, 4 Drawing Sheets

SEMICONDUCTOR DEVICE

BACKGROUND OF THE INVENTION

1. Field of the Invention

The present invention relates to a semiconductor device, more specifically, it relates to a semiconductor device with a plurality of semiconductor chips stacked.

2. Detailed Description of the Related Art

FIG. 7 shows a conventional semiconductor device with a plurality of semiconductor chips 2, 3 stacked on a substrate 1. As a high density mounting technique, a technique of laminating and mounting a plurality of semiconductor chips on a substrate, called stack mounting is used.

In the stack mounting, in general, the substrate and the stacked semiconductor chips are connected by wire bonding. Therefore, the semiconductor chips are stacked from one with a larger chip size so as to prevent interference of a semiconductor chip stacked above with a bonding pad of a semiconductor chip disposed below.

Since the bonding pad on the substrate is provided around the semiconductor chip in the lowermost layer, the upper layer semiconductor chip with a smaller chip size has a longer distance with respect to the bonding pad on the substrate. Therefore, with a larger chip size difference in the upper layer and the lower layer, the distance between the bonding pad of the upper layer semiconductor chip and the bonding pad on the substrate becomes longer. In particular, the wire connecting the substrate to the chip becomes longer. Accordingly, the wire strength is lowered so that sagging of the wire by its own weight occurs. Tilting of the wire at the time of sealing, or the like is generated so as to deteriorate the yield, which is problematic.

FIG. 8 is a cross-sectional view of a semiconductor device disclosed in the unexamined Japanese Utility Model Publication (KOKAI) No. 2-146436.

The semiconductor device shown in FIG. 8 is a hybrid IC with IC chips stacked in two stages with the IC chips butted with each other and connected by a solder bump, wherein only the lower chip 20 is wire bonded, because the lower IC chip 20 is formed larger than the upper IC chip 30. However, according to the semiconductor device shown in FIG. 8, a problem is involved in that the lower semiconductor chip 20 should be provided with a pad matching with the upper semiconductor chip 30, and further, the lower semiconductor chip 20 should be a dedicated semiconductor chip to serve as a pair with the upper semiconductor chip 30.

SUMMARY OF THE INVENTION

Accordingly, an object of the present invention is to provide a novel semiconductor device with an improved yield by solving the problems in the above-mentioned conventional technology, in particular, by shortening the wire length per one loop so as to eliminate the problems of wire sagging by its own weight, tilting of the wire at the time of sealing, or the like.

In order to achieve the above-mentioned object, the present invention basically adopts the technological configurations described below.

That is, a first aspect of the present invention is a semiconductor device with a plurality of semiconductor chips stacked on a substrate, wherein the semiconductor device comprising; a wiring layer disposed so as to be sandwiched between the semiconductor chips, and a plurality of bonding pads, for connecting a bonding wire, provided on the wiring layer, thereto.

In the second aspect of the present invention, a connection wiring for connecting the bonding pads is provided in the wiring layer.

In the third aspect of the present invention, a plurality of bonding pads are disposed so as to surround a semiconductor chip stacked on an upper surface of the wiring layer.

In the fourth aspect of the present invention, a via hole is provided in the wiring layer, this via hole is connected to a bonding pad of a semiconductor chip disposed below the wiring layer.

DESCRIPTION OF PREFERRED EMBODIMENTS

Hereinafter, embodiments of the semiconductor devices according to the present invention will be described in detail with reference to the drawings.

First Embodiment

Figure 1:
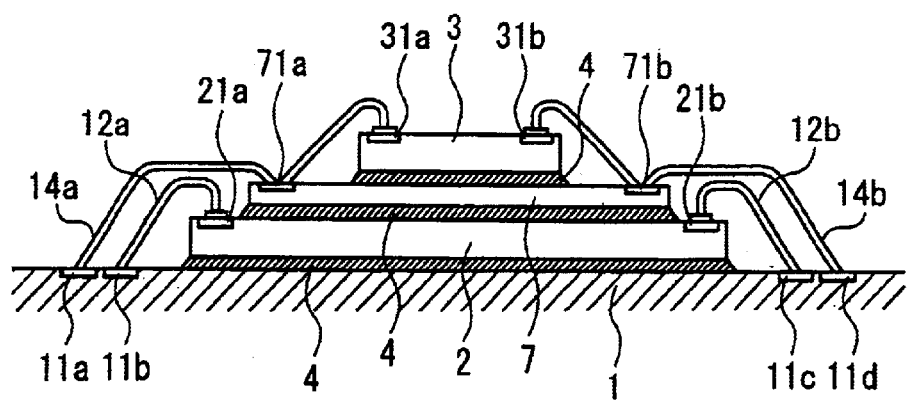
FIG. 1 is a cross-sectional view showing a first embodiment of a semiconductor device according to the present invention.

FIG. 1 is a cross-sectional view showing a first embodiment of a semiconductor device according to the present invention. The semiconductor device shown in FIG. 1 has a plurality of semiconductor chips 2, 3 stacked on a substrate 1, wherein a wiring layer 7 is provided between the semiconductor chips 2, 3 for relaying wires 14a, 14b for wire bonding. Relaying bonding pads 71a, 71b are provided in the wiring layer 7.

Hereinafter, the first embodiment will be described in further detail.

In the first embodiment, the semiconductor chip 2 having an integrated circuit, a polyimide tape 7 with a copper foil layer interposed therein, and the semiconductor chip 3 having an integrated circuit are stacked and mounted by an adhesive 4 in this order on the printed wiring substrate 1 with a resin base material having an electric circuit of a copper wiring.

The printed wiring substrate 1, the semiconductor chip 2, and the semiconductor chip 3 each have bonding pads 11a to 11d, bonding pads 21a, 21b, and bonding pads 31a, 31b, capable of wire bonding for connection of the circuit stored in each thereof and an external circuit. Moreover, relaying pads 71a, 71b, connected to the copper foil layer, for wire bonding are provided in the polyimide tape 7.

A desired operation can be obtained by electrically connecting the circuits stored each in the printed wiring substrate 1, the semiconductor chip 2, and the semiconductor chip 3 with each other.

According to the semiconductor device with the configuration, the circuits stored in the printed wiring substrate 1 and the semiconductor chip 2 can be connected electrically by connecting the bonding pads 11b, 11c and the bonding pads 21a, 21b by wires 12a, 12b, respectively.

Similarly, the circuits stored in the printed wiring substrate 1 and the semiconductor chip 3 can be connected electrically by connecting the bonding pads 11a, 11d and the bonding pads 31a, 31b by wires 14a, 14b, respectively. In this case, the wires 14a, 14b are arranged from the bonding pads 31a, 31b of the semiconductor chip 3 for connection with the relaying pads 71a, 71b of the polyimide tape 7, and further connection with the bonding pads 11a, 11d of the printed wiring substrate 1.

Wiring connection of three or more bonding pads like stepping stones is called stitching, which is a common technique of wire bonding.

Second Embodiment

Figure 2:
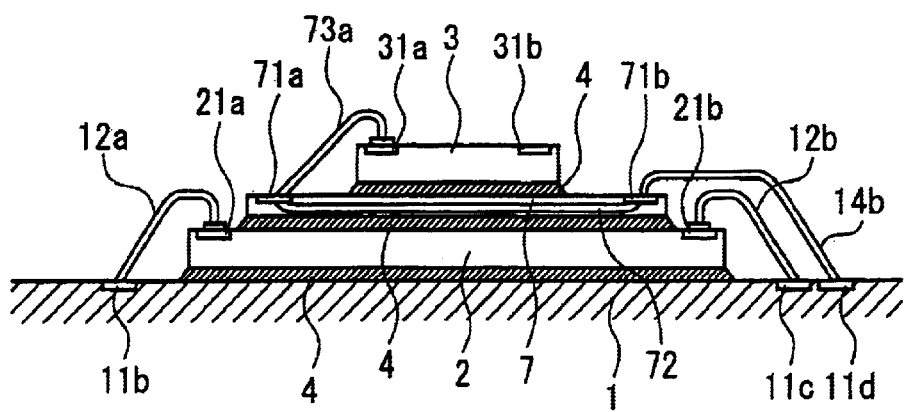
FIG. 2 is a cross-sectional view showing a second embodiment of a semiconductor device according to the present invention.

FIG. 2 is a cross-sectional view showing a second embodiment of a semiconductor device according to the present invention. The semiconductor device shown in FIG. 2 has a wiring layer 7 provided with at least two relaying bonding pads 71a, 71b, and a connection wiring 72 for connecting the two relaying bonding pads 71a, 71b which are disposed so as to surround a semiconductor chip 3 stacked on the upper surface of the wiring layer 7.

Hereinafter, the second embodiment will be described in further detail.

The second embodiment comprises the semiconductor device shown in FIG. 2, wherein relaying pads 71a, 71b are connected electrically by a wiring 72 in the inner layer of a polyimide tape 7.

In the second embodiment, for example, a bonding pad 31a of the semiconductor chip 3 and a bonding pad 11d on a printed wiring substrate 1 on the opposite side with respect to the semiconductor chip 3 are connected via the inner layer wiring 72 of the polyimide tape 7. According to the configuration, in addition to the effects obtained by the first embodiment, the effect of improving the freedom in arranging the wiring between the printed wiring substrate 1 and the semiconductor chip 3 (in this case 73a, 14b) can be obtained.

Third Embodiment

Figure 3:
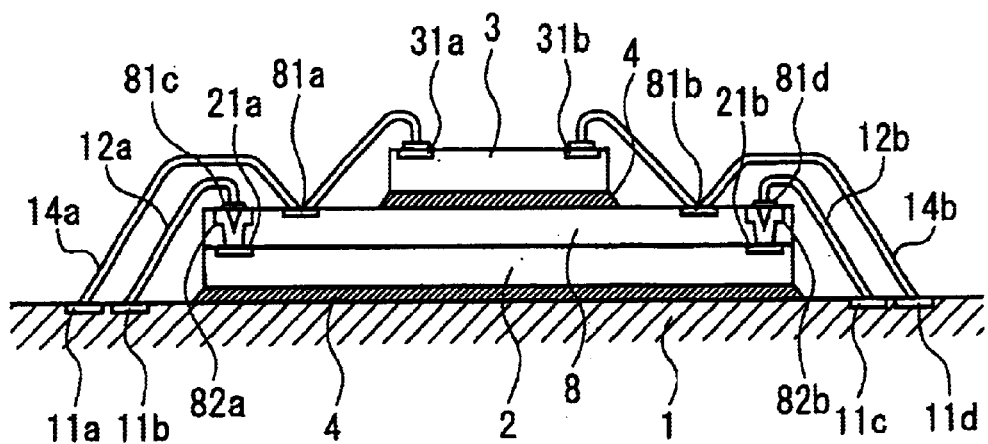
FIG. 3 is a cross-sectional view showing a third embodiment of a semiconductor device according to the present invention.
Figure 4:
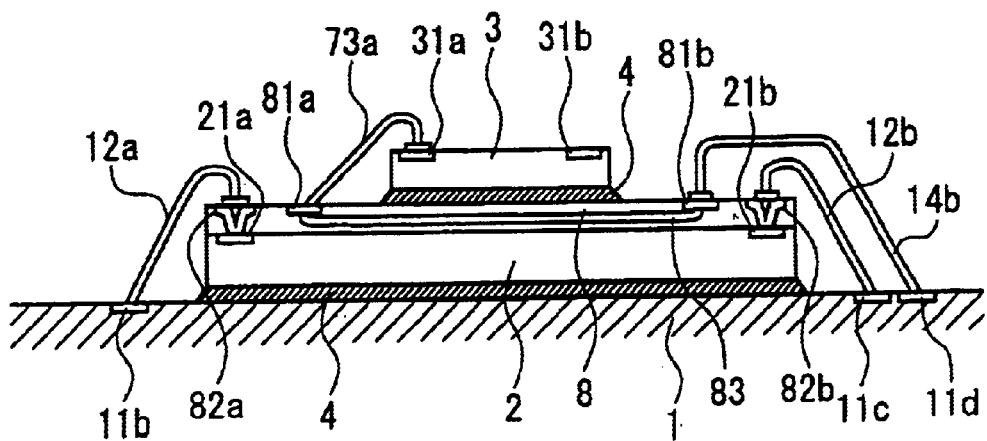
FIG. 4 is a cross-sectional view showing a modified embodiment of the second embodiment.

FIGS. 3 and 4 are cross-sectional views showing a third embodiment of a semiconductor device according to the present invention. The semiconductor device shown in the figures has a wiring layer 8 provided with relaying bonding pads 81c, 81d, and via holes 82a, 82b connected with the relaying bonding pads 81c, 81d as well as formed through the wiring layer 8.

In the semiconductor device, the via holes 82a, 82b of the wiring layer 8 and bonding pads 21a, 21b of the semiconductor chip 2 provided below the wiring layer 8 are connected.

Hereinafter, the third embodiment will be described in further detail.

In the embodiment shown in FIG. 3, a wiring layer 8 formed by laminating polyimide and aluminum layers is provided on the semiconductor chip 2 instead of the polyimide tape 7.

According to the third embodiment, similar to the first embodiment, the relaying pads 81a to 81d are provided on the wiring layer 8 and the via holes 82a, 82b are provided on the wiring layer 8. The bonding pads 21a, 21b of the semiconductor chip 2 are connected to the via holes 82a, 82b so as to lead out the wirings of the bonding pads 21a, 21b to the surface of the wiring layer 8, respectively, and wirings 12a, 12b from the bonding pads 81c, 81d on the wiring layer 8 to the bonding pads 11b, 11c on the printed wiring substrate 1 are provided.

FIG. 4 shows an embodiment in which optional relaying pads 81a and 81b are connected electrically by a wiring 83 provided in the inner layer of the wiring layer 8.

According to the configuration, in addition to the above-mentioned effects, freedom in arranging the wiring between the printed wiring substrate 1 and the semiconductor chip 3 can be improved.

Fourth Embodiment

Figure 5:
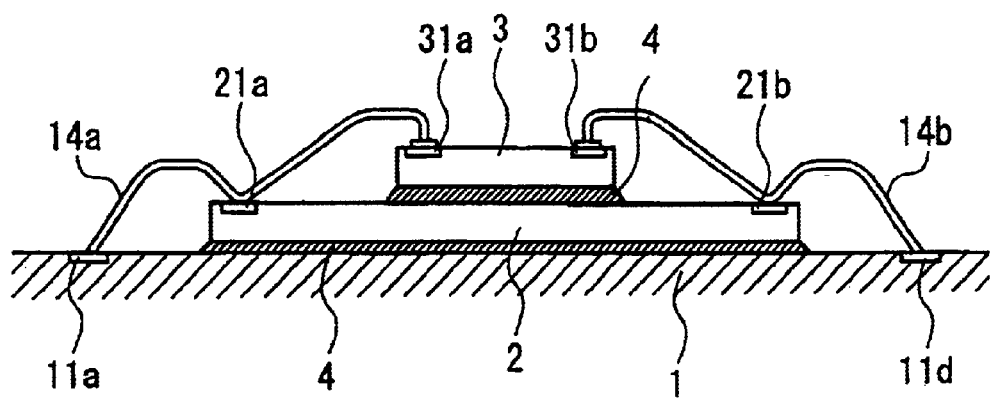
FIG. 5 is a cross-sectional view showing a fourth embodiment of a semiconductor device according to the present invention.
Figure 6:
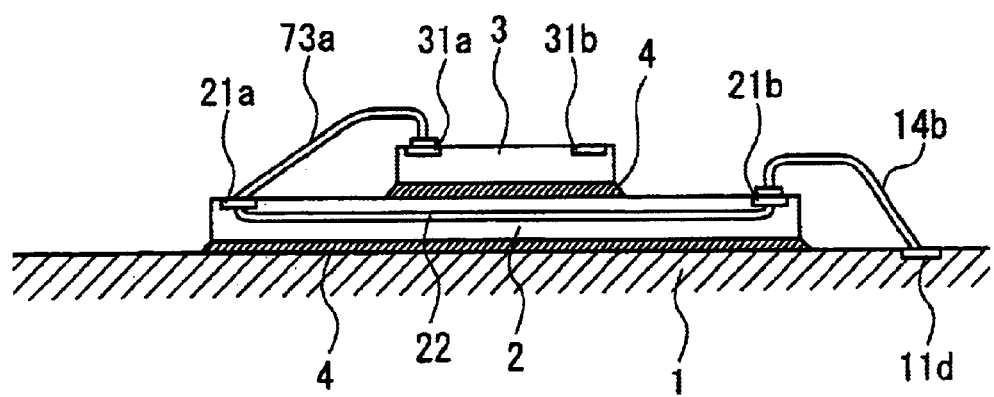
FIG. 6 is a cross-sectional view showing a modified embodiment of the fourth embodiment.
Figure 7:
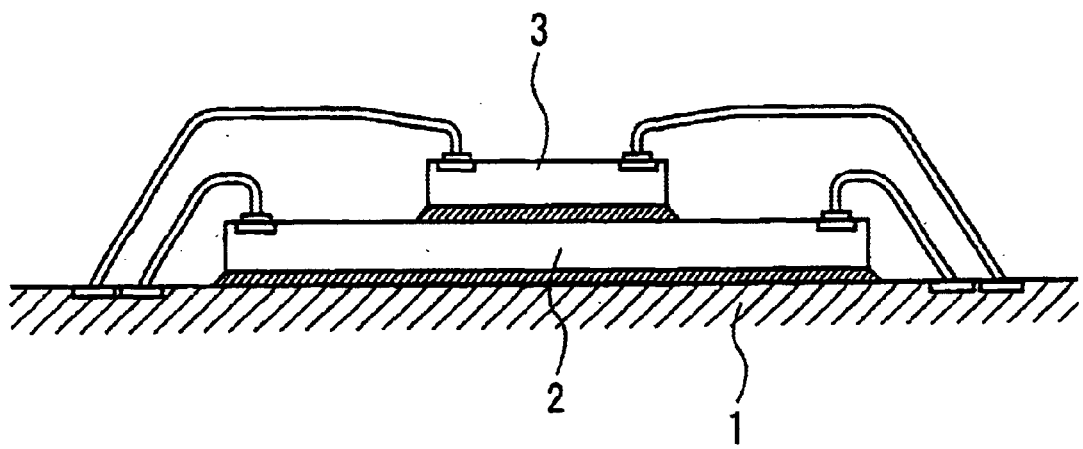
FIG. 7 is a cross-sectional view showing a conventional embodiment.
Figure 8:
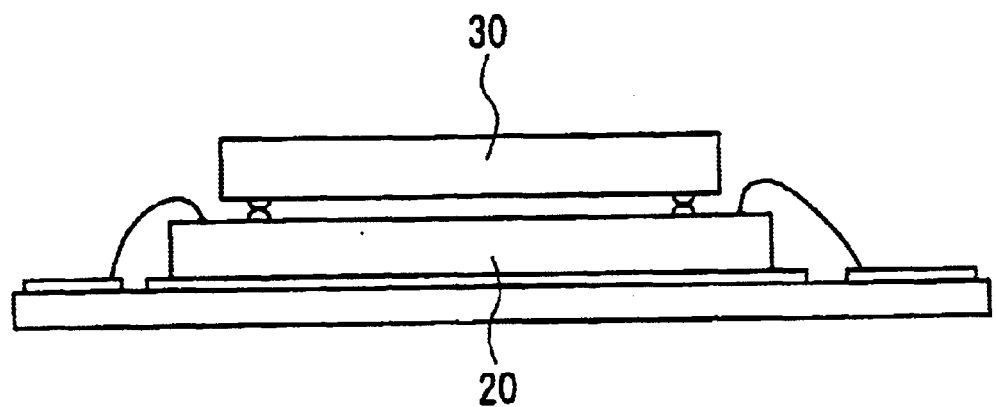
FIG. 8 is a cross-sectional view showing another conventional embodiment.

FIGS. 5 and 6 are cross-sectional views showing a fourth embodiment of a semiconductor device according to the present invention.

FIG. 5 shows an embodiment with a semiconductor chip 2 provided as a cell base IC.

The cell base IC is a semi-custom LSI with a commonly used integrated circuit, such as a memory and a gate array, provided preliminarily in a semiconductor chip so that connection among circuits or connection with a bonding pad can be executed later according to the application. Since there is freedom in connecting the internal integrated circuit and the bonding pad, an unused bonding pad can be provided to some extent at an optional position. FIG. 5 shows an embodiment having the unused bonding pads 21a, 21b as a relaying pad. Compared with the embodiments shown in FIGS. 1 to 4, it has a simple configuration so that the effect of facilitating the assembly work can be provided.

FIG. 6 shows an embodiment in which optional unused bonding pads 21a, 21b of the semiconductor chip 2 are connected by a connection wiring 22 in the semiconductor device shown in FIG. 5. Also in this case, the effect of improving the arrangement of wiring between the printing wiring substrate 1 and the semiconductor chip 3 can be obtained.

According to the semiconductor device of the present invention, owing to the above-mentioned configurations, since the wire length per one loop can be shortened, deterioration of the wire strength can be prevented, and thus the conventionally generated problems are eliminated so as to improve the yield.

What is claimed is:

1. A semiconductor device comprising:
   a substrate;
   a first semiconductor chip on said substrate;
   a second semiconductor chip overlying said first semiconductor chip;
   a wiring layer between said first and second semiconductor chips, said wiring layer including a polyimide tape having a copper foil layer between layers of said polyimide tape;
   a plurality of bonding pads on said wiring layer, said substrate and said first and second semiconductor chips; and
   a plurality of bonding wires for connecting said plural bonding pads to each other,
   wherein said copper foil layer traverses said wiring layer from a first bonding pad on said wiring layer to a second bonding pad on said wiring layer,
   wherein said copper foil is connected to said substrate through a first bonding wire only at said first bonding pad, and
   wherein said copper foil is connected to said second semiconductor chip through a second bonding wire only at said second bonding pad.

2. The semiconductor device according to claim 1, further comprising a via hole in said wiring layer, said via hole having a contact for connecting one of said plural bonding pads on the wiring layer to one of said plural bonding pads on said first semiconductor chip.

3. The semiconductor device according to claim 1, wherein,
said first bonding wire connects one of said plural bonding pads on said substrate to said first bonding pad on said wiring layer;
said second bonding wire connects said second bonding pad on said wiring layer to one of said plural bonding pads on said second semiconductor chip; and
a third bonding wire connects one of said plural bonding pads on said substrate to one of said plural bonding pads on said first semiconductor chip.

4. The semiconductor device according to claim 3, further comprising a via hole in said wiring layer, said via hole having a contact for connecting yet another one of said plural bonding pads on the wiring layer to one of said plural bonding pads on said first semiconductor chip.

5. A semiconductor device comprising:
a substrate;
a first semiconductor chip on said substrate;
a second semiconductor chip overlying said first semiconductor chip;
a wiring layer between said first and second semiconductor chips, said wiring layer including a conductor laminated between polyimide layers;
a plurality of bonding pads on said wiring layer, said substrate and said first and second semiconductor chips; and
a plurality of bonding wires for connecting said plural bonding pads to each other,
wherein said second semiconductor chip is mounted on said wiring layer by an adhesive material and said wiring layer is provided on said first semiconductor chip without using an adhesive material,
wherein said conductor inside said wiring layer is outside said second semiconductor chip and is connected to a first bonding pad on said wiring layer nearest a first edge of said second semiconductor chip and is connected to a second bonding pad on said wiring layer nearest a second edge of said second semiconductor chip,
wherein said conductor is connected to said substrate only at said first bonding pad, and
wherein said conductor is connected to said second semiconductor chip only at said second bonding pad.

6. The semiconductor device according to claim 5, wherein
a first bonding wire connects one of said plural bonding pads on said substrate to one of said plural bonding pads on said first semiconductor chip;
a second bonding wire connects one of said plural bonding pads on said substrate to to said first bonding pad on said wiring layer; and
a third bonding wire connects said second bonding pad on said wiring layer to one of said plural bonding pads on said second semiconductor chip, said second and third bonding wire being electrically connected through said conductor.

7. The semiconductor device according to claim 5, wherein said wiring layer comprises a lamination of polyimide layer and an aluminum layer.

8. The semiconductor device according to claim 5, further comprising a via hole in said wiring layer, said via hole having a contact for connecting one of said plural bonding pads on the wiring layer to one of said plural bonding pads on said first semiconductor chip.

9. The semiconductor device as claimed in claim 5, wherein the second edge is opposite the first edge.

10. A semiconductor device comprising:
a substrate;
a first semiconductor chip on said substrate;
a second semiconductor chip overlying said first semiconductor chip;
a wiring layer between said first and second semiconductor chips, said wiring layer including an inner layer conductor traversing said wiring layer;
a plurality of bonding pads on said wiring layer, said substrate and said first and second semiconductor chips; and
a plurality of bonding wires for connecting said plural bonding pads to each other,
wherein said inner layer conductor traverses said wiring layer from a first bonding pad on said wiring layer to a second bonding pad on said wiring layer,
wherein said inner layer conductor is connected to said substrate only at said first bonding pad, and
wherein said inner layer conductor is connected to said second semiconductor chip only at said second bonding pad.

11. The semiconductor device according to claim 10, further comprising a via hole in said wiring layer, said via hole having a contact for connecting one of said plural bonding pads on the wiring layer to one of said plural bonding pads on said first semiconductor chip.

12. The semiconductor device as claimed in claim 10, wherein said wiring layer is integral with said first semiconductor chip.

13. A semiconductor device comprising:
a substrate;
a first semiconductor chip on said substrate;
a second semiconductor chip overlying said first semiconductor chip;
a wiring layer between said first and second semiconductor chips, said wiring layer including a polyimide tape having a copper foil layer between layers of said polyimide tape;
a plurality of bonding pads on said wiring layer, said substrate and said first and second semiconductor chips;
a plurality of bonding wires for connecting said plural bonding pads to each other; and
a via hole in said wiring layer, said via hole having a contact for connecting one of said plural bonding pads on the wiring layer to one of said plural bonding pads on said first semiconductor chip,
wherein said second semiconductor chip is mounted on said wiring layer by an adhesive material and said wiring layer is provided on said first semiconductor chip without using an adhesive material,
wherein said copper foil layer is outside said second semiconductor chip and is connected to a first bonding pad on said wiring layer nearest a first edge of said second semiconductor chip and is connected to a second bonding pad on said wiring layer nearest a second edge of said second semiconductor chip, wherein said copper foil layer is connected to said substrate only at said first bonding pad, and wherein said copper foil layer is connected to said second semiconductor chip only at said second bonding pad.

14. The semiconductor device as claimed in claim 13, wherein the second edge is opposite the first edge.

* * * * *